United States Patent [19]

Lumsden

[11] 4,388,690

[45] Jun. 14, 1983

[54] AUTOMATIC METER READING TRANSPONDER

[75] Inventor: James R. Lumsden, Edmonton, Canada

[73] Assignee: AEL Microtel Limited, Burnaby, Canada

[21] Appl. No.: 199,389

[22] Filed: Oct. 21, 1980

Related U.S. Application Data

[63] Continuation-in-part of Ser. No. 83,990, Oct. 11, 1979, abandoned, which is a continuation-in-part of Ser. No. 881,791, Feb. 27, 1978, abandoned.

[51] Int. Cl.³ .................. H04Q 9/00; G01R 11/64
[52] U.S. Cl. .................................. 364/483; 364/493; 364/900; 340/825.07; 340/825.52
[58] Field of Search ............ 364/483, 492, 493, 200, 364/900; 340/150, 151, 152 R, 152 T, 147 R, 825.07, 825.52; 375/80, 88, 91

[56] References Cited

U.S. PATENT DOCUMENTS

| | | | |
|---|---|---|---|
| 3,747,068 | 7/1973 | Bruner et al. | 364/483 |
| 3,815,093 | 6/1974 | Caretto et al. | 340/152 T |
| 3,820,073 | 6/1974 | Vercellotti et al. | 340/151 |
| 3,832,637 | 8/1974 | Alexander et al. | 375/91 |
| 3,866,175 | 2/1975 | Seifert, Jr. et al. | 340/151 |
| 3,899,741 | 8/1975 | Brandt | 375/80 |
| 3,922,492 | 11/1975 | Lumsden | 340/152 T |
| 4,001,785 | 1/1977 | Miyazaki et al. | 364/200 |
| 4,218,737 | 8/1980 | Buscher et al. | 364/493 |

Primary Examiner—Gary Chin

[57] ABSTRACT

The present invention relates to an automatic meter reading transponder. The transponder is comprised of a receiver for receiving an external instruction and a transmitter for transmitting data. A CPU is connected to the receiver and the transmitter. A ROM is connected to the CPU and ROM contains a program for controlling the operation of the CPU. A real time clock is connected to the CPU for determining sequential predetermined time periods. Three input terminals are connected to the CPU for receiving data to be stored in a RAM. One of the three input terminals has pulses impressed thereon, the number of pulses being representative of electric power consumption. The one input terminal is also connected, via the CPU to a time-of-day memory. The memory is comprised of a plurality of discretely addressable registers wherein the CPU equates each addressable register sequentially with a consecutive one of the predetermined time periods, so that each register sequentially contains a count which is representative of the power consumed during its associated time period or any fraction thereof. The CPU activates the transmitter to transmit data upon receipt of the external instruction. The data is, in part, the contents of each register in the time-of-day memory transmitted in sequence.

16 Claims, 5 Drawing Figures

AUTOMATIC METER READING TRANSPONDER

This is a continuation-in-part of U.S. patent application Ser. No. 083,990 now abandoned, filed Oct. 11, 1979, which was a continuation-in-part of U.S. patent application Ser. No. 881,791 now abandoned which was filed on Feb. 27, 1978.

INTRODUCTION AND GENERAL DISCUSSION

The present invention relates to a transponder for performing a plurality of measuring functions and more particularly to a transponder whose functions are controlled by a microprocessor.

One of the problems met by today's ever increasing demand for electric power is the tremendous capacity necessary to handle peak loads at particular hours of the day. For example, if power consumption were to remain constant during the entire day, the present electric power generating facilities would be adequate for many years into the future.

It has therefore become important to be able to measure the power consumption of individual dwellings on an hourly basis with each hour being equated to a real time hour in the day (time-of-day consumption). Once it is possible to measure power consumption on an hourly basis, it is possible to reward consumers for maintaining a relatively low power consumption during peak load hours and to penalize consumers who use a large amount of power during peak load hours. The present invention, in addition to being able to measure accumulated consumption of the electric power utility, the water utility and the gas utility, can measure and store the consumption of electric power on an hourly basis.

The next step in moderating power consumption is for the utility to be able to shut off non-essential loads in the consumer's home when the power consumption for a given time period approaches a predetermined level.

A particular embodiment of the present invention is capable of performing this load shedding function upon receipt of the correct coded message from a central computer.

Embodiments of the transponder are also capable of continuously scanning a plurality of alarm inputs and transmitting their status to a central location. Alarms such as fire and illegal entry alarms are contemplated.

Prior art systems have contemplated the storage of accumulated consumption data, peak demand data, and load control on two-way power lines, single-way transmitting systems and even telephone lines. However, none of the prior art systems have envisaged a combined system of keeping track of accumulated consumption data, time-of-day data and alarm data and performing load control over a two-way communication link, for example, a telephone system.

It is imperative to such a system that transmission security be high. This high security ensures that only the correct transponder is activated and valid data transmitted to the central computer. No prior art systems have provided this high security.

High baud rates necessary to accurately transmit time-of-day data and load control verification are not possible using power lines as the communication link. Such baud rates are possible using two-way radio links, however, the cost of the necessarily large number of radio transmitters is prohibitive. Such high baud rates can be achieved using a telephone system as the communication link.

The system of the present invention combines all of the above features into one system requiring transponders of low power. This combined result provides an economically feasible system.

In this disclosure the term "time-of-day consumption" means that power units are monitored and stores on a predetermined time basis over an extended time period. For example, an hourly time-of-day memory stored total accumulated power units consumed in a one hour time period over an extended time, for example, 30 days.

Peak demand consumption means the maximum recorded consumption at a particular time within a predetermined time period.

A peak demand reading can be extracted from accumulated time-of-day information.

The heart of the transponder is a custom microprocessor which, under the influence of a clock pulse frequency, cycles through a program. Instruction word sets are sent from a central computer to the transponder. These instruction word sets activate subroutines of the program contained within the microprocessor so that specific information is taken out of storage in the transponder and transmitted to the central computer. When this program is functioning without receipt of an instruction word set, the transponder continues to operate in a "housekeeping" mode. In this mode, the transponder accumulates and stores the current level of consumption of utilities attached thereto. In addition, it enters the hourly consumption rate of the electric power utility into a time-of-day memory unit. The transponder is also capable of scanning the alarm inputs. If an alarm exhibits a valid alarm signal, this information is stored and transmitted to the central computer the next time that the transponder is scanned by the central computer. All transponders in the system contemplated by an embodiment of the present invention are scanned approximately every thirty seconds.

In order to ensure a low probability of error in the receipt of instruction data sets and the transmission of data word sets from the transponder to the central computer a unique decoding and coding system has been developed.

An instruction word set consists of five words each having a start bit, 8 data bits, a parity bit and a stop bit. The first word in the set is an alert word and consists of all logic level "1's". The second word is an identification code word. Each transponder, at the time of its installation, has hard wired therein an identification code. The microprocessor, upon receipt of an instruction word set compares the second word with the code hard wired therein and accepts the instruction word set if and only if the identification words coincide. In This way, a plurality of transponders can be connected to the same telephone line and be distinguishable from one another by the central computer. It should be understood that the transponder of this invention is normally used in conjunction with the subscriber's existing telephone line. This line can be either a private or party line. As a result, the transponder according to this invention operates on a non-dedicated communication link. The third word in the instruction word set is an instruction/control word which modifies the program in the microprocessor to perform, in addition to its "housekeeping" functions, some special task. The fourth word in the instruction word set is a data word. If, for example, the instruction word received by the transponder requests the transponder to load data into a specific time register, the data word would be the information loaded therein. The last word in the instruction word set is a block parity word.

The microprocessor checks each word for parity. In addition, each word is checked to ensure that the entire word is received in the correct time frame. Finally, the entire instruction word set is checked for block parity and framing.

The transponder forms a data word set for transmission to the central computer. The first word is an alert word. The second word is the identification code word of the transponder. The third word is a customer identification code word. Upon initialization of the transponder, the central computer sends to the transponder a customer identification code word. Unless this customer identification code word is specifically removed from the transponder by the central computer, the transponder thereafter exhibits the customer identification code word each time it is transmitting data to the central computer. The customer identification code word is necessary in the event that the telephone company interchanges the telephone line in a particular cable. The fourth to the (4+N−1)th word represents data stored in the transponder requested by the central computer. The (4+N)th word is a block parity word and the (4+N+1)th word is an end of transmission code word.

Using these unique instruction word sets and data word sets, information can be exchanged by the central computer and a transponder with a very low probability of error.

SUMMARY OF THE INVENTION

The objects of the present invention are met by providing a transponder unit which has a receiver for receiving an external instruction. A transmitter is also provided for transmitting data. A central processing unit is connected to the receiver and the transmitter. A read only memory is connected to the CPU and contains the program for controlling the CPU. A real time clock is connected to the CPU and is used for determining sequential predetermined time periods. Three input terminals are connected to the CPU for receiving data to be stored in a random access memory. One of the input terminals has pulses impressed thereon which represent the consumption of electric power. That terminal is connected, via the CPU to a time-of-day memory.

The memory is comprised of a plurality of discretely addressable registers, wherein the CPU equates each addressable register sequentially with a consecutive one of the predetermined time periods. As a result, each register sequentially contains a count which is representative of the power consumed during its associated time period. Upon receipt of the external instruction, the CPU activates the transmitter to transmit data. The data is, in part, the contents of each register in the time-of-day memory, transmitted in sequence.

INTRODUCTION TO THE DRAWINGS

The present invention will be described hereinbelow with the aid of the accompanying drawings in which:

FIGS. 1 and 2 form a schematic diagram of a particular transponder according to the present invention;

DETAILED DESCRIPTION OF PREFERRED EMBODIMENT

Figure 1:
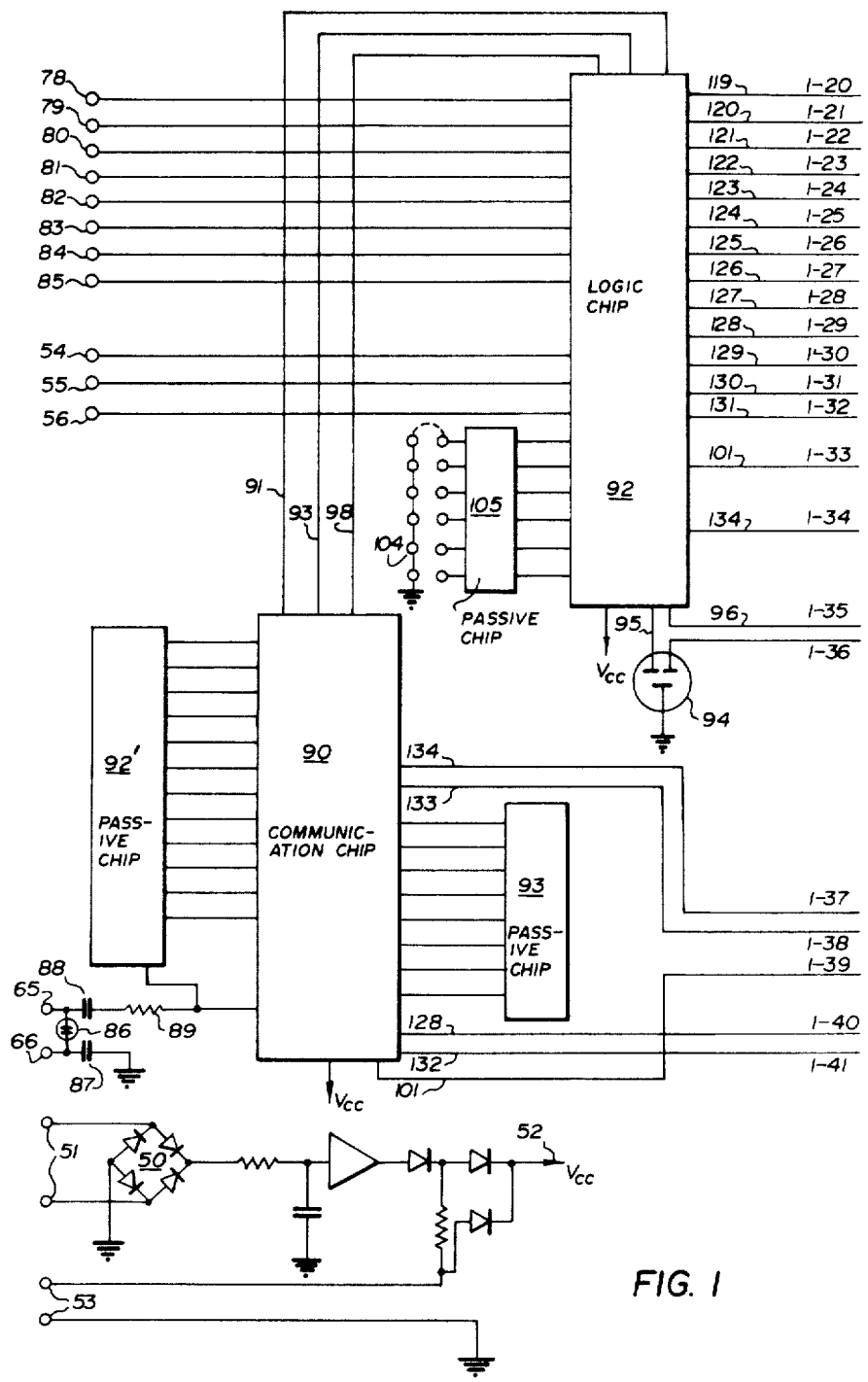
Figure 2:
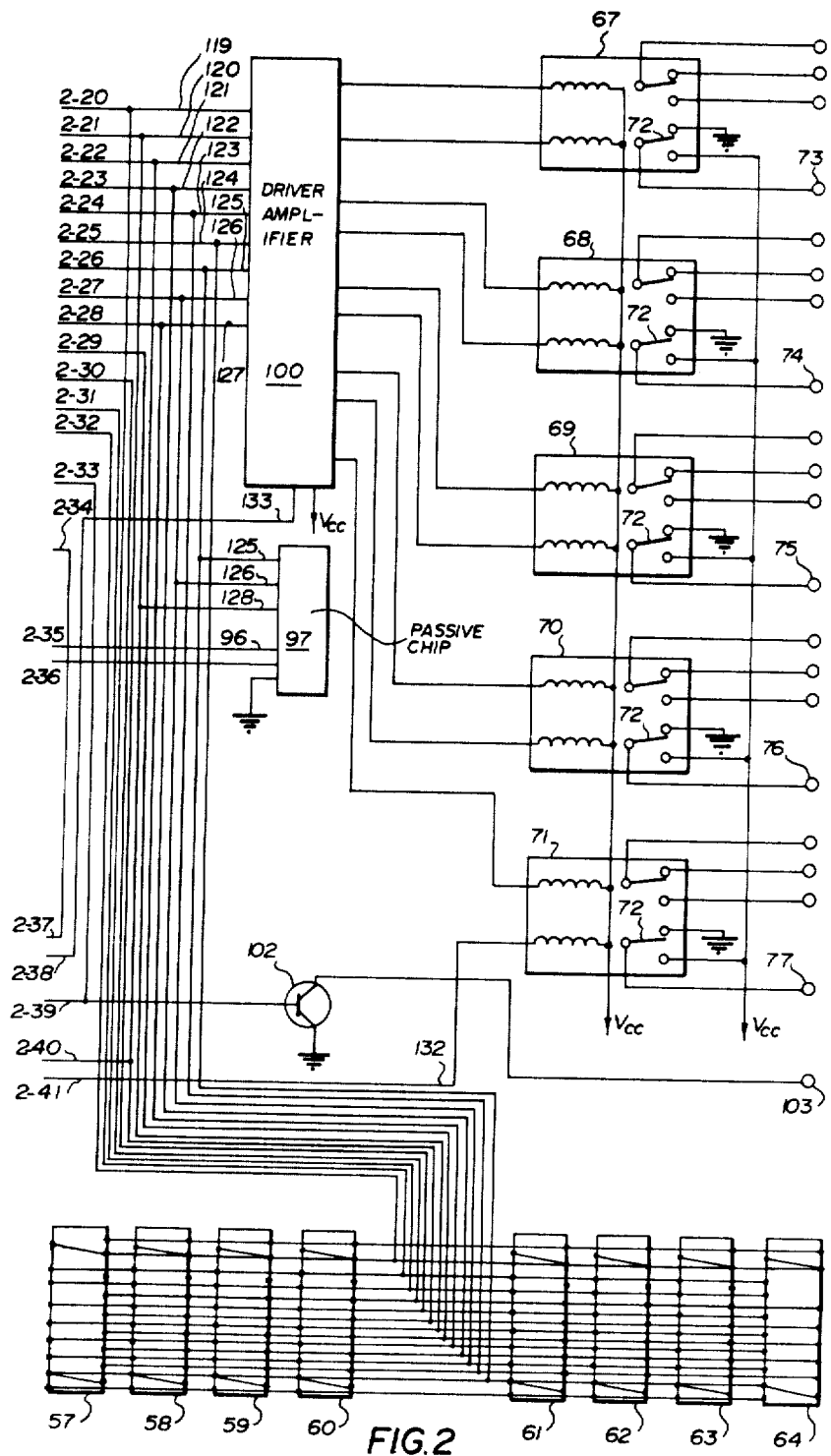

FIGS. 1 and 2 form a single schematic diagram. It should be noted that for example, line 1-20 in FIG. 1 is connected to line 2-20 in FIG. 2.

Referring now in detail to the embodiment of the invention shown in FIGS. 1 and 2, it can be seen that the transponder is powered by a voltage supply consisting of a diode bridge 50 coupled to a low voltage AC source 51. The output is filtered and controlled and provides a Vcc at terminal 52. This voltage Vcc feeds all of the active elements of the transponder. A supply battery is connected to terminals 53. The battery is always connected to the circuit and is automatically activated when the regular power supply fails. The battery, being connected in this way, is always subjected to a trickle charge so that it is immediately ready to take over in the event of a power supply failure.

As was mentioned above, the transponder performs several functions. Input terminals 54, 55 and 56 are connected to electricity, gas and water meters, respectively. The transponder maintains an accumulated record of the consumption of these three utilities. In addition, the consumption of the electricity utility is recorded on an hourly basis in the time-of-day memory stores 57, 58, 59, 60, 61, 62, 63 and 64.

Instructions are sent to and data is received from the transponder via telephone lines 65 and 66.

One type of instruction sent to the transponder might be a load shed instruction. In the event that an electricity consumer was reaching some predetermined quota during a peak demand time, a coded signal could be sent via lines 65 and 66 which would activate any one or all of load shedding relays 67, 68, 69, 70 and 71. These relays would be connected to luxury items which consume large quantities of electric power, for example, an air conditioner or an electric clothes dryer.

Each relay is fitted with a set of supervisory contacts 72 which are connected to terminals 73, 74, 75, 76 and 77, respectively. Four of the five terminals 73 to 77 may be connected to status input terminals 78, 79, 80 and 81. The central computer scans each transponder repeatedly every short while and one piece of information that the computer requests during such a scan is the condition of the status terminals 78–81. Since the relays are of a latching type the terminals 73 to 77 are either at ground potential or at Vcc and these conditions are relayed, during a scan, to the central computer via their interconnection to status terminals 78 to 81. As a result, when the central computer sends a command to load shed, the load shed is either correctly or incorrectly performed and a positive indication is returned to the central computer.

Terminals 82, 83, 84 and 85 are connected to alarms, for example, fire alarms and/or intrusion alarms. The condition of the terminals 82–85 switch their logic level voltage if an associated alarm is activated. This change in logic level voltage is relayed to the central computer when the computer scans the transponder. The voltage appearing on an alarm terminal when an associated alarm is activated can return to its deactivated level after a short predetermined period of time. However, the internal logic of the transponder will continue to transmit an alarm condition when scanned until the transponder is reset by a positive command from the central computer. This is important when, for example, an intrusion alarm is connected since a burglar may only activate the alarm for a short period of time.

The commands sent to the transponder and the information sent from the transponder are transmitted as mark and space frequency bursts on the telephone lines 65 and 66. The frequency of the mark and space signals can be, for example, 2225 and 2025 Hz, respectively in the direction from the central computer to the transponder and 2225 and 1270 Hz for the mark and space frequencies in the direction from the transponder to the cenral computer. The value of the frequencies of the mark and space signals are not important to the present invention. The circuitry of the transponder may be adapted to operate on any frequencies chosen within reason and the selection of the frequencies does not form a part of the present invention.

The telephone lines 65 and 66 have a gas discharge device 86 connected thereacross. This discharge device protects the electronic circuitry from large overvoltages which could, by accident, occur across lines 65 and 66. Capacitors 87 and 88 remove any direct current voltage that might appear on the lines. The RC time constant of capacitors 87 and 88 and resistor 89 limit the duration of current of a 10 KV pulse which may also appear on the telephone lines 65 and 66. Internal zener protection further reduces the incoming voltage to an acceptable level.

The incoming mark and space signals and the outgoing mark and space signals are processed in a communication chip 90 which will be described in detail hereinbelow. At present it is sufficient to say that the communication chip 90 processes the incoming mark and space signals and converts them to "high" and "low" logic level voltages for use in the remainder of the electronic circuitry. This digital received data is output from line 91. The communication chip 90 contains all of the active elements used to process the incoming mark and space frequencies. The vast majority of passive elements needed to perform this function and others are contained in two passive chips 93 and 92'. By using these passive chips for the passive elements in the system NPO capacitors and 50-100 ppm resistors can be used. These elements are extremely temperature stable and allow the use of narrow band techniques having very stable characteristics.

The control of various functions of the transponder is performed by a microprocessor which forms a portion of C-MOS chip 92. Chip 92 will be described in detail hereinbelow with reference to FIG. 4. Chip 92 decodes incoming instruction signals to ensure that they have been correctly received by the correct transponding unit. In addition, the chip formulates and codes data to be sent back to the central computer. The output from the chip to be sent back to the central computer is in the form of a synthesized mark and space signal and is fed to communication chip 90 via line 93. Chip 92 continuously stores the accumulated data from the three utility inputs 54, 55 and 56. In addition, the chip enters the appropriate time-of-day data in the correct address of the time-of-day memory units 57 to 64. The chip also decodes and sends signals to the load shedding circuitry and monitors the status points 78 to 81 and the alarm terminals 82 to 85.

The program in the microprocessor is advanced by clock pulses generated by crystal controlled unit 94. The clock is used in two locations in the transponder. One location to which it is fed is chip 92 via line 95 and via line 96. Passive elements of the crystal oscillator are housed in passive chip 97. The second location to which the clock pulse is fed is to chip 90 via line 98. The load shedding relays 67 to 71 must be driven and the chip 92 cannot handle the appropriate power. As a result, chip 100 is provided which receives signals from chip 92 and accordingly drives the appropriate relay.

The output section of the communication chip 90 is controlled by a modem enable signal fed to the chip 90 via line 101 from the chip 92. This signal turns on the output circuitry of the communication chip and delays the initial transmission of data back to the central computer.

The system does not necessarily need a telephone line connecting the transponder to the central computer. A radio link can also be used. The radio transmitter, when used, will have a finite "power up" time, i.e. a length of time between its turn on and its ability to transmit data. To ensure that all the data is transmitted, the length of the delay of the modem enable signal is programmable. When a telephone line is being used, the delay is short, in the order of 50 ms. When the radio link is being used, the delay is longer, in the order of 500 ms. The delay is programmable from 50 to 1500 ms. The modem enable signal can be used to turn on the radio transmitter and therefore the signal controls power transistor 102 to selectively ground output terminal 103.

As mentioned above, the transponder, according to the present invention, is in constant two-way communication with a central computer. The central computer sends a coded message to the transponder which, in addition to performing a "housekeeping" program, decodes the message and performs certain specific tasks, sending a reply message back to the central computer. It is important therefore that the correct message be sent to the correct transponder and that the transponder perform a certain specific function only when that correct message is correctly received and decoded. The present invention has a specific circuitry built into it to test the quality of the received message to ensure that it has been correctly sent, received and decoded.

The computer and transponder communicate with one another using data words. Each data word consists of a start bit, 8 data bits, a parity bit and a stop bit.

The computer must send five words in an instruction word set to the transponder before it will be activated. The first word is an alert word which consists of all logical "1's". For the purpose of clarity it should be noted that a "high" logic level voltage, a mark frequency burst and a logical "1" are the same and a "low" logic level voltage, a space frequency burst and a logical "0" are the same. The next word sent to the transponder is an identification code. This code contains 6 active data bits and 2 inactive data bits. Jumper wires generally indicated at 104 in FIG. 1 are either connected or not connected to 6 inputs of chip 105 to set the identification code into the chip 92 at the time of installation of the transponder. Once the identification code has been set, the transponder will not be activated unless it receives an identification code word from the central computer which has 6 active bits coinciding with the 6 bit identification code entered into the chip 92 via the jumper wires 104. Since 6 bits go to make up one identification code it can be seen that as many as 64 transponders can be connected to a single telephone line pair and be individually activated by the central computer. The jumper wires activate pull up resistors in chip 105 which enter either a logical "1" or a logical "0" into chip 92.

The third data word contains the instruction code and the control bits. This word actually tells the transponder which one of many functions to perform. The next word is a data word and contains the data that the transponder will need to perform its instruction. For example, if the instruction was to load the time clock register, the fourth word would be the information, i.e. the time to be loaded into the time clock register. If no special data is necessary for the transponder to perform a function then the data word is filled with the baud rate that the transponder is to return its stored data back to the central computer. The central computer always sends information and instructions to the transponder at a baud rate of 150. The transponder can send information back to the central computer at a baud rate of 1200, 600, 300 or 150. If, for example, the transponder was set to transmit at a rate of 1200 baud and the computer did not, after performing its data check, receive the correct information, it could request the transponder to resend the information at a slower baud rate which might clear up the problem if the problem was, for example, a bad telephone line.

The fifth word in the instruction word set is a block parity word. The C-MOS chip 92 checks each of the five data words to ensure that they have the correct word parity. Chip 92 also performs a framing check to ensure that the entire word is sent in a correct time period. Finally, a block parity check and a block framing check is performed. The parity of all five data words is checked column by column. In this manner, the probability of a transponder being falsely activated is extremely low.

The computer, by sending a single instruction word set consisting of five data words, can perform all of the interrogations and resettings necessary to operate the transponder. The one exception to this is the loading of the accumulators. The data word (the fourth word) has only a 2 digit capacity and the accumulator registers have 6 digit capacity. Therefore, the fourth word cannot completely define the entire accumulator register. As a result, in order to load a single accumulator register, the entire instruction word set must be transmitted three times. The first time it is sent, the control bits of the third word are set to indicate the loading of the first 2 digit positions of the 6 digit register and the data word (the fourth word) contains the data to be loaded therein. The second time the instruction word set is sent, the control portion of the third word is set to indicate the loading of the second set of 2 digit portions of the 6 digit accumulator register in question, and so on until the entire 6 digit register is loaded.

A listing of the instructions that the transponder is capable of receiving are as follows:

---
Interrogate all three accumulators
Interrogate status word
Interrogate accumulators and status words
Interrogate time-of-day memory
Interrogate time-of-day memory, status word and accumulator
Reset - Accumulator 1 and retransmit
Reset - Accumulator 2 and retransmit
Reset - Accumulator 3 and retransmit -continued Reset - Time-of-day memory and Tx. status word
Reset - Alarm register and Tx. status word
Load - Accumulator 1 and retransmit
Load - Accumulator 2 and retransmit
Load - Accumulator 3 and retransmit
Load - Time clock register and Tx. status word
Load - Customer identification code and Tx. status word
Control 1 and Tx. status word
Control 2 and Tx. status word
Control 3 and Tx. status word
Control 4 and Tx. status word
Control 5 and Tx. status word
Baud rate - set for 150 B. ⎫
Baud rate - set for 300 B.   ⎬ and Tx. status word
Baud rate - set for 600 B.   
Baud rate - set for 1200 B. ⎭
Tx. control delay - set for 50 ms ⎫
Tx. control delay - set for 100 ms
Tx. control delay - set for 200 ms
Tx. control delay - set for 300 ms
Tx. control delay - set for 400 ms
Tx. control delay - set for 500 ms
Tx. control delay - set for 600 ms
Tx. control delay - set for 700 ms ⎬ and Tx. status word
Tx. control delay - set for 800 ms
Tx. control delay - set for 900 ms
Tx. control delay - set for 1000 ms
Tx. control delay - set for 1100 ms
Tx. control delay - set for 1200 ms
Tx. control delay - set for 1300 ms
Tx. control delay - set for 1400 ms
Tx. control delay - set for 1500 ms ⎭
Diagnostic RAM test pattern Tx. results
---

It should be noted, from the above listing, that all of the instructions require the transponder to retransmit. In other words, if an accumulator is reset, the reset data is retransmitted to the central computer to ensure that the transponder has correctly carried out the reset. This is an important advantage since it provides a positive indication of a requested action.

When the second interrogation listed above is transmitted, four data words are transmitted by the transponder back to the central computer. The first data word is the baud rate at which the transponder was set and the transmit delay time of the modem enable signal. The second word contains information concerning the four alarm inputs 82 to 85 and the four status inputs 78 to 81 shown in FIG. 1. The third word is the time clock information of the transponder. This information is compared with a time standard at the central computer and must coincide. The fourth and last data word sent back to the central computer is the contents of the time-of-day memory.

The transponder sends a set of words back to the central computer in a given sequence. This set of words is known as a data word set. The first word is an alert word as defined above. The second word is the transponder identification code word as mentioned above. The third word is the customer identification code word. When the transponder is initialized, the central computer allots a customer identification code to the transponder which is permanently stored thereafter. Each time the transponder transmits, it must therefore transmit a customer identification code word.

The fourth to the (4+N−1)th words are data words and represent the data stored in the transponder which has been requested by the central computer. The data group, i.e. word four to (4+N−1) could be very long, for example, when the central computer requested a read out of the time-of-day memory. The (4+N)th word is a block parity word. As a result, it can be seen that all of the data, no matter how long, is checked for both word and block parity. The (4+N+1)th word is an end of transmission code word.

Figure 3:
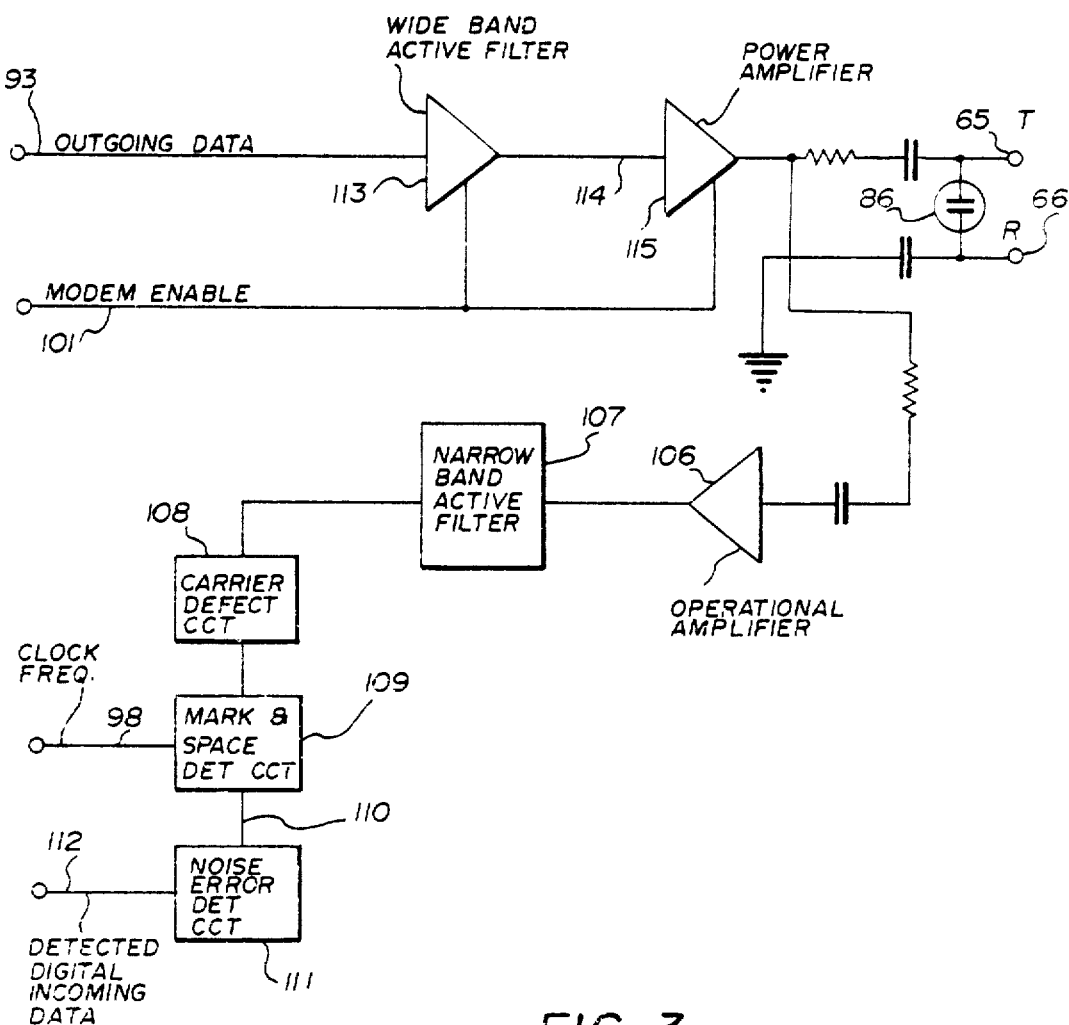
FIG. 3 is a block diagram of a particular large scale integrated circuit (LSI) used in the schematic diagram of FIGS. 1 and 2 as a "communication" chip.

Communication chip 90 will now be discussed in detail with respect to FIG. 3. The tip and ring telephone lines 65 and 66 are connected to the input of communication chip 90. The chip can be broken down into a receiver section and a transmitter section. The receiver section contains a high impedance operational amplifier 106. Its function is to isolate the telephone line from the remainder of the receiver section of the chip so that the receiver section of the chip appears electronically "invisible" to the telephone lines. The output of the amplifier 106 is fed to a narrow band active filter 107 which has a sufficient band width to handle both the mark and space frequencies of the incoming signal. The output of filter 107 is fed to a carrier detect circuit 108. If this circuit detects a mark frequency for a predetermined minimum length of time it is activated and passes the mark frequency along with subsequent space and mark frequency bursts on to a mark and space detecting circuit 109. The sine waves making up the mark and space frequency bursts entering the detecting circuit 109 are squared via, for example, a saturated amplifier, and compared with two clock frequencies which are precisely set at the desired input frequencies of the mark and space signals. This basic clock frequency is fed to the detecting circuit 109 from chip 92 in FIG. 1 via line 98. The two internal clock frequencies are compared with the squared mark and space signals on a time and measurement basis. If the clock frequency representing the mark frequency is correctly compared with the incoming squared mark frequency, the detector 109 produces, for the length of time of the squared mark frequency, a "high" logic level voltage output on line 110. The clock frequency which is precisely equal to the space frequency is compared with the incoming squared space frequency. If these two frequencies coincide, detector 109 produces, for the time duration of the squared space frequency, a "low" logic level voltage output. The entire detector circuit 109 is in a quiescent state under normal conditions and is only activated upon receipt of a mark frequency of a particular duration of time from carrier detector circuit 108.

The detector circuit 109 has an adjustable tolerance. This tolerance is adjusted by lengthening or shortening the "on" time of the clock pulses. By lengthening the "on" time of the clock pulses, the circuit tolerance to slight frequency alterations of the mark and space signal is enhanced. For example, assuming a 2225 Hz mark frequency, if the "on" time of the clock pulse is 1 microsecond, the detector circuit will tolerate a ±1 Hz alteration of the 2225 Hz mark frequency. By the same token, if the "on" time duration of the clock pulse were lengthened to 5 microseconds, the detector circuit would tolerate a ±5 Hz alteration in the 2225 Hz mark frequency. This toleration to slight changes in frequency is necessary in order to correct for drift under severe temperature conditions in which the transponder may be operating.

It should be noted that the above discussion regarding the tolerance of the detector circuit is an example to illustrate the operation of the circuit. The figures used do not necessarily represent those figures which would result in an actual embodiment.

The detector 109, therefore, converts mark and space signals into digital logic level voltages. These logic level voltages are fed via line 110 to a noise error detector circuit 111.

Circuit 111 is capable of ignoring high noise levels of short duration which may be superimposed on the detected mark and space frequencies. High noise levels of short duration manifest themselves in short duration signals of the wrong logic level voltage appearing in the digital output signal. Circuit 111 counts the number of such opposite logic level voltage bursts over a specified period of time and ignores a predetermined number of them, for example, three. If less than three such opposite bursts occur in any predetermined time period, circuit 111 is designed to ignore them and produces a corrected digital output signal on line 112. If the opposite bursts are more numerous than the predetermined number in a predetermined time period, erroneous data is produced and the parity checking circuit in chip 92 will reject the incoming data requiring a retransmission to the transponder from the central computer.

The output data of the chip 92 for transmission back to the central computer is in the form of synthesized mark and space signals of frequencies of 2225 and 1270 Hz, respectively. The synthesized signal produces an approximation of a sine wave by the addition of a plurality of unit step functions of the appropriate polarity. This synthesized signal must be made smooth or analog before it is transmitted. The transmitter section of the communication chip 90 performs this function. The synthesized signal is fed from chip 92 to wide band active filter 113 via line 93. The wide band active filter 113 has a sufficient band width limitation so as to smooth out the synthesized signal. The output of the filter 113 is fed via line 114 to a tri-state power amplifier 115. The amplifier, when it is turned off, presents a very high output impedance to the telephone lines 65 and 66. When the modem enable signal activates the power amplifier 115, the impedance drops. As a result, when the transponder is not transmitting, it appears practically electronically invisible to the telephone line. As mentioned above, a modem enable signal is generated in chip 92 and activates the transmitter section of the communication chip including both the active filter 113 and the power amplifier 115. The modem enable signal is fed to the communication chip via line 101.

The narrow band filter 107 has a band width that strongly limits the injection of the transmitted mark and space signals into the receiver section of the communication chip. The mark and space detecting circuit 109 further rejects any remaining transmitted mark and space signals because the signal would have the wrong frequency content.

For the sake of convenience, the chip 90 has other circuitry incorporated therein to be discussed below. However, this additional circuitry does not in any way affect the receiver and transmitter sections of the chip.

Figure 4:
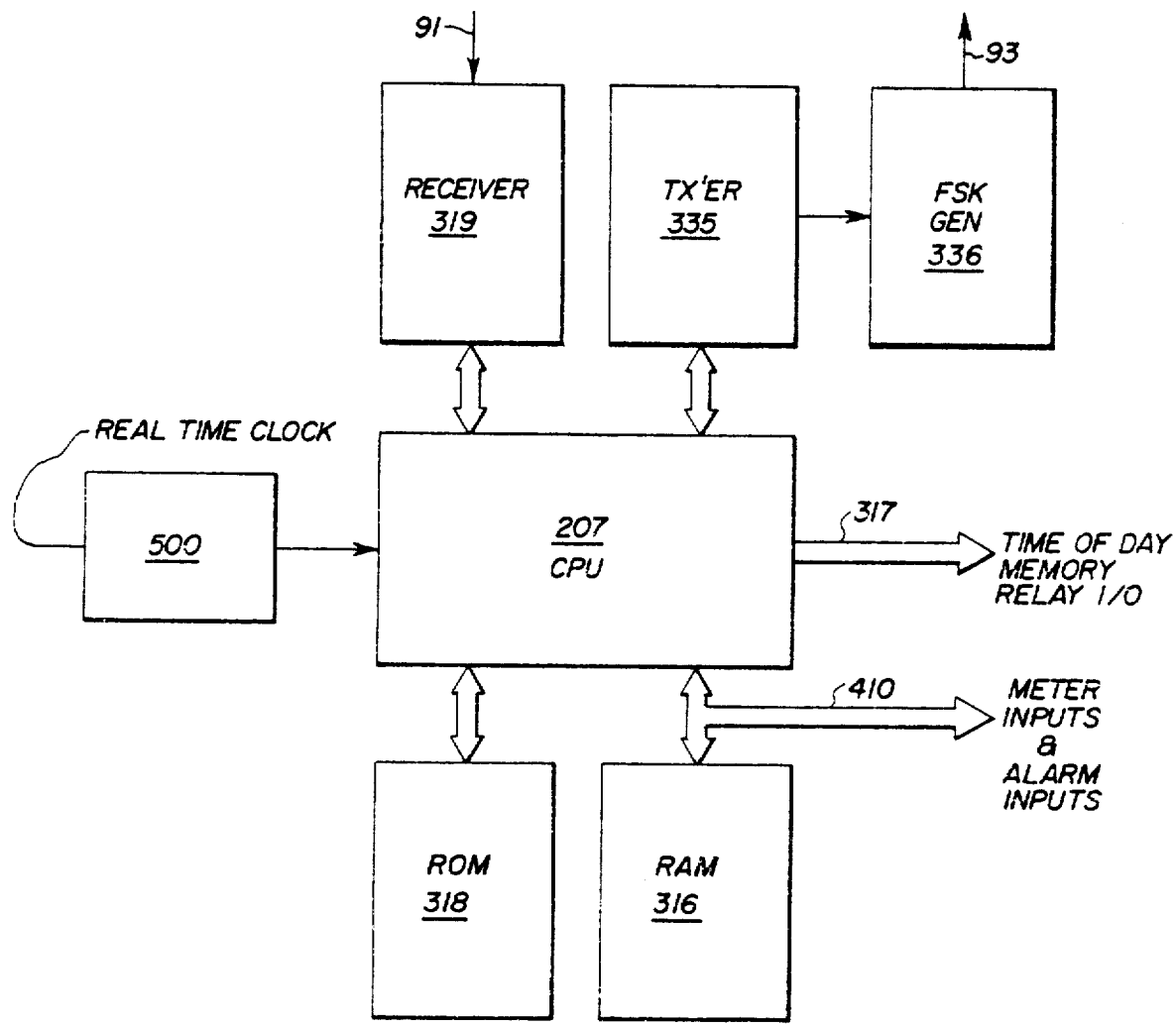
FIG. 4 is a block diagram of a particular LSI chip used in the schematic diagram of FIGS. 1 and 2 as a main logic chip.

The operation of the C-MOS chip 92 will be discussed in detail with reference to FIG. 4. A portion of chip 92 consists of a random access memory (RAM9 316, central processor unit (CPU) 207, and read only memory (ROM) 318. The CPU 207 interfaces with the vast majority of other circuitry of the transponder via input/output data interfaces 317 and 410. The cyclic operation of the transponder is completely controlled by a program programmed into ROM 318. The accumulation of data from the utilities, the storage into memory of the time-of-day consumption information and the load shedding are all controlled by the cyclic operation of the program stored in ROM 318. The program is incremented from instruction to instruction via the clock frequency generated by crystal 94 in FIG. 1.

The program performs a complete "housekeeping" cycle approximately every 1.5 ms. The "housekeeping" cycle can be interrupted to receive I/O messages. These messages are stored until the "housekeeping" cycle is completed and are then processed by appropriate subroutines of the program. For example, the "housekeeping" cycle scans the alarm inputs and the meter inputs and updates appropriate accumulators and the time-of-day memory. During this cycle the transponder could receive a request to transmit back to the central computer the contents of the accumulators. The "housekeeping" cycle is temporarily interrupted to decode this instruction. The instruction is stored and the cycle resumed. When the cycle is completed the program is sent to the appropriate subroutine to carry out the instruction stored. Upon completion of the instruction the "housekeeping" cycle is begun again.

Digital data from the communication chip 90 is fed into a receiver section 319 of chip 92 via line 91. Receiver section 319 and CPU 207 check word and block parity, timing and framing. If all is in order, the CPU 207 executes the instruction at the end of the current "housekeeping" cycle.

The transponder is capable of keeping track of the electric power consumption on an hourly basis for a period of approximately 42 days. In addition to being fed to an accumulator register as described above, the pulses are fed to time-of-day memory 57-64. During a 1 hour time period a particular address in time-of-day memory 57 to 64 is continuously filled by pulses representing the power consumed during that 1 hour. At the end of that time period, CPU 207 increments the address of time-of-day memory 57-64 so that subsequent pulses for the next time period fill the next address location. This hourly incrementing of the time-of-day memory 57 to 64 begins upon initialization and is repeated continuously until being reset. Upon reset the time-of-day memory 57-64 is cleared and the above described sequence begins again.

When the transponder is initialized a real time clock 500 is set in the transponder. As a result, the accumulation of power consumed during any fraction of the first hour is stored as well as power consumed during each subsequent 1 hour time period. In other words, if the real time clock is set on the half hour, and thereafter the address locations in the time-of-day memory are incremented each hour on the hour, the address for that first consumption measurement will relate to only one half hour. The ROM 318 contains the initial starting address for storage of the time-of-day accumulations in the time-of-day memory 57 to 64. This initial address is loaded into RAM 316. This initial address is incremented for each subsequent time-of-day transfer to the time-of-day memory 57 to 64. The first memory space in the time-of-day memory is used for storing the size of the fraction of the first hour after initialization or resetting. The second memory location contains the quantity of power consumed for this fractional time period. The next and subsequent address locations contain the quantity of power consumed for each subsequent time period.

The transponder of this embodiment has a time-of-day memory 57 to 64 in which each address location has an 8 bit binary count and so the largest number storable in any 1 hour time period is 256 units of energy consumed.

Lines 119 to 128 in FIG. 1 are 10 address and memory lines interconnecting the CPU 207 in chip 92 with the eight memory units 57 to 64. Lines 126 and 128 are connected to resistor chip 97 and are presently terminated therein since there are ten address/data lines and only eight memory units. Line 125 is also connected to a resistive network in chip 97. Depending on the termination of this line, chip 92 operates in the function described above or in a telementry mode.

Lines 129, 130 and 131 are the read/write scan lines which enable the CPU 207 to write into and read out of various address positions within the time-of-day memory units.

Memory and address lines 119 to 127 are also connected to relay driver chip 100. Relay driver chip 100 contains nine driving amplifiers which produce enough power to activate relays 67 to 70 and one half of relay 71. Since relay driver chip 100 contains only nine amplifiers, a tenth has been placed in communication chip 90 to operate the second half of load shedding relay 71 via lines 128 and 132.

When it is requested by the central computer to load shed in a dwelling containing a transponder, the correct logic voltage levels appear on lines 119 through 128. The ten amplifiers must be turned on in order to activate their associated relays. This is accomplished by a signal appearing on MUX line 133. The signal is derived from chip 92 on line 134 and is amplified in a MUX amplifier contained in communication chip 90. Thus, simultaneously, upon the generation of the MUX signal by chip 92, all the relays are switched in accordance with the logic signals appearing on lines 119 through 128. It should be noted, that since lines 129, 130 and 131 are inactive during load shedding, signals appearing on lines 119 to 128 do not affect memories 57 to 64.

The chip 92 also contains a transmit coder unit 335. The coder unit is controlled by CPU 207 and produces a series of digital words upon receipt of the appropriate instruction word set. The series of digital words is the data word set and is comprised of an alert word, a word representing the transponder identification code, the customer identification code, a series of data words, a block parity word and an end of transmission word.

Transmit coder 335 is connected to an FSK generator 336 which produces, as mentioned above, a synthesized version of the sinusoidal wave mark and space frequencies. A "high" logic level voltage representing a "1" bit in the series of digital words to be transmitted is converted into a burst of synthesized mark frequency. A "low" logic level voltage representing a "0" bit in the series of digital words to be transmitted is converted into a burst of synthesized space frequency. The output of the FSK generator is fed to communication chip 90 via line 93.

Some of the input circuitry to the transponder may be connected to mechanical contact type components which are susceptible to contact bounce. The transponder according to the present invention eliminates this contact bounce by virtue of a debounce subroutine in the main program. The microprocessor scans each utility input twice in two consecutive passes. The same response must appear on more than one pass before a valid pulse is stored or an accumulator incremented. The debounce subroutine cycles the scan of these utility inputs once every 15 ms and since a contact bounce would be faster than that, the circuit is virtually immune from registering an incorrect pulse due to contact bounce.

The alarm inputs have devices connected thereto which could produce momentary signals wrongly indicating a valid warning. This problem is eliminated by comparing the signal on each alarm over a 500 ms time period. If a signal still appears as an alarm input after this time, a valid alarm is assumed. The program scans the alarm inputs several times during the 500 ms time period.

Figure 5:
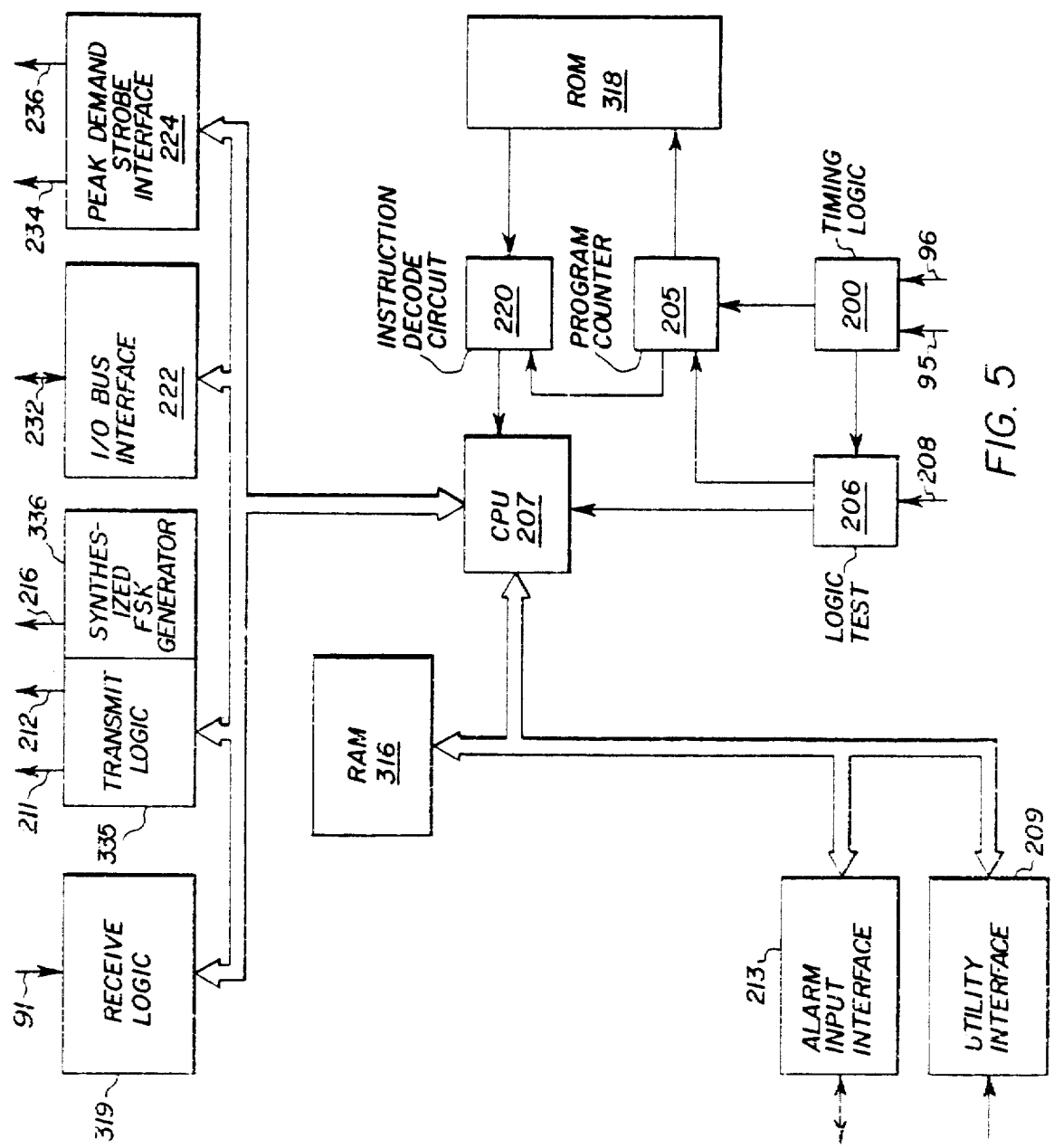
FIG. 5 is a detailed block diagram of the logic chip shown in FIG. 1.

The program which controls the operation of the entire system is stored in a ROM 318 and operates via a series of subroutines. For the sake of economy, logic chip 92 is a LSI chip and contains many logic elements. However, the same results could be obtained using many interconnected discrete integrated circuit components. FIG. 5 shows in detail the various components which go to make up a particular LSI chip used in a particular embodiment of the present invention. It should be noted that with respect to FIGS. 4 and 5, like blocks have been given like reference numerals.

The timing signals are generated by piezoelectric element 94 (FIG. 1) and timing pulses enter the chip via lines 95 and 96. Timing logic block 200 controls these pulses and feeds them to the various components of the LSI chip. Timing pulses are fed to program counter 205 which conditions the ROM 318 to sequence it through the various steps of the computer program stored therein. Program statements from ROM 318 are fed to CPU 207 via an instruction decode circuit 220.

Receiver logic 319 receives the decoded information from communication chip 90 and upon instruction from CPU 207 transfers the correct information to CPU 207 which, in turn, transfers it to RAM 316. Transmit logic 335 receives information to be transmitted from CPU 207, after transfer of the information from RAM 316. Transmit logic 335 is capable of transmitting digital information directly via lines 211 and 212. This logic sets up the correct pulse train for transmission, i.e., it adds the start, stop and parity bits and sets up the correct framing. The digital information can also be fed to block 336 where it is translated into an FSK signal for transmission via line 216.

Block 222 is the I/O bus interface between CPU 207, the time-of-day memory and load control components. The time-of-day memory 57–64 shown in FIG. 2, is connected to block 222 via bus 232. Block 224 is the interface between the CPU 207 and the time-of-day memory for read/write strobe signals. These signals are transmitted over bus 234. This block also generates the MUX signal which is transmitted via line 236.

The CPU 207 handles the alarm inputs and the three utility consumption inputs. Alarm input interface block 213 interfaces the various alarms with CPU 207. Utility interface block 209 interfaces the inputs from the utility meters with CPU 207. The addresses for interfaces 209 and 213 are actual memory locations in RAM 316.

The entire system can be sent through a logic test program upon the activation of block 206. Logic test block 206 is activated by applying a high logic level voltage to line 208. Not shown in FIG. 5 are the X register, the Y register and the X,Y address decode logic which places the various data in the correct addresses in RAM 316.

The computer program is hard wired into ROM 318 in machine language. Each statement in the program consists of a 12 bit data word. Bits 0, 1, 2, 3 and 8 are used for direct addressing. Bits 4, 5, 6 and 7 are used for data or for further instruction decoding. Bits 9, 10 and 11 specify the actual instruction group. In the program listed below, the statement number and the value of bits 9, 10 and 11 are given.

In the program to follow, the various instructions are given using the following notation.

L = contents of memory location L
P = literal data
CF = carry flag—set if one is to be carried in AC
AC = accumulator
RM = contents of memory location indirectly accessed via X and Y
R = literal data

| | |
|---|---|
| [0/1][P][L] = | Skip the next instruction if the result of "ANDing" the contents of location 0,L (1,L) with P is not equal to zero. |
| [2/3][P][L] = | Skip the next instruction if the result of "ANDing" the contents of location 0,L (1,L) with P is equal to zero. |
| [4/5][P][L] = | Skip the next instruction if the contents of memory at location 0,L (1,L) is not equal to P. |
| [6/7][P][L] = | Skip the next instruction if the contents of memory at location 0,L (1,L) is equal to P. |
| [8/9][P][L] = | Take the value of P and place it in the location 0,L (1,L). |
| [A/B][P][R] = | Set the program counter to the address specified by 0,P,R (1,P,R). |
| [C/D][0][L] = | 1 Is added to the contents of location L and then placed back in location L. If the result of the operation generated a carry, CF will be 1. |
| [C/D][1][L] = | The value of CF is added to the contents of location L and then placed back in location L. If the result of the operation generated a carry, CF will be 1. |
| [C/D][2][L] = | Not a valid instruction. |
| [C/D][3][L] = | Not a valid instruction. |
| [C/D][4][L] = | The value of the accumulator is placed in location L. |
| [C/D][5][L] = | The contents of location L are "ANDed" with the contents of the accumulator and the result is placed back in location L. |
| [C/D][6][L] = | The contents of location L are exclusive "ORed" with the contents of the accumulator and the result is placed back in location L. |
| [C/D][7][L] = | The contents of location L are "ORed" with the contents of the accumulator and the result is placed back in location L. |

-continued

| | | |
|---|---|---|
| C/D 8 L | = | The contents of location L are placed in the accumulator. |
| C/D 9 L | = | Not a valid instruction. |
| C/D A L | = | Skip the next instruction if the contents of location L are not equal to the contents of the accumulator. |
| C/D B L | = | Skip the next instruction if the contents of location L are equal to the contents of the accumulator. |
| C/D C L | = | Not a valid instruction. |
| C/D D L | = | The contents of location L are "ANDed" with the contents of the accumulator and the result is in the accumulator. |
| C/D E L | = | The contents of location L are exclusive "ORed" with the contents of the accumulator and the result is in the accumulator. |
| C/D F L | = | The contents of location L are "ORed" with the contents of the accumulator and the result is in the accumulator. |
| E/F 0 | = | Take the contents of the location specified by (X,Y) and add 1 placing the result back into (X,Y) along with the indicated carry. |
| E/F 1 | = | Take the contents of the location specified by (X,Y) and add the carry 1 placing the remainder back into (X,Y) and CF. |
| E/F 4 | = | Take the contents of the accumulator and put it in location (X,Y). |
| E/F 5 | = | Take the contents of the location as specified (X,Y) and "AND" it with the contents of the accumulator and return the result to the location (X,Y). |
| E/F 6 | = | Take the contents of the location as specified (X,Y) and exclusive "ORed" it with the contents of the accumulator and return the result to the location (X,Y). |
| E/F 7 | = | Take the contents of the location as specified (X,Y) and "ORed" it with the contents of the accumulator and return the result to the location (X,Y). |
| E/F 8 | = | Take the contents of the location as specified (X,Y) and put it in the accumulator. |
| E/F A R | = | Skip the next instruction if the contents of location (X,Y) equals the contents in location R. |
| E/F B R | = | Skip the next instruction if the contents of location (X,Y) does not equal the contents in location R. |

-continued

| | | |
|---|---|---|
| E/F C R | = | Take the contents of location R and put it in the accumulator. |
| E/F D R | = | Take the contents of location (X,Y) and "AND" it with the contents in location R and put the result in the accumulator. |
| E/F E R | = | Take the contents of location (X,Y) and exclusive "OR" it with the contents in location R and put the result in the accumulator. |
| E/F F R | = | Take the contents of location (X,Y) and "OR" it with the contents in location R and put the result in the accumulator. |

The following is a computer program for the chip:

| PROGRAM START | |
|---|---|
| 000 | 000 |
| 001 | 877 |
| 002 | 877 |
| 003 | E40 |
| 004 | 846 |
| 005 | E00 |
| 006 | EA0 |
| 007 | ACF |
| 008 | 067 |
| 009 | A16 |
| 00A | EAA |
| 00B | A0F |
| 00C | 217 |
| 00D | EB6 |
| 00E | A16 |
| 00F | EC0 |
| 010 | E40 |
| 011 | C07 |
| 012 | 667 |
| 013 | A05 |
| 014 | EC8 |
| 015 | C74 |
| PULSE INPUT | |
| 016 | 807 |
| 017 | 846 |
| 018 | E80 |
| 019 | C40 |
| 01A | 210 |
| 01B | A70 |
| 01C | 877 |
| 01D | 856 |
| 01E | EEF |
| 01F | C40 |
| 020 | EEF |
| 021 | CB0 |
| 022 | A60 |
| 023 | CD5 |
| 024 | C51 |
| 025 | 041 |
| 026 | A38 |
| 027 | 28F |
| 028 | A2D |
| 029 | EC5 |
| 02A | C64 |
| 02B | 214 |
| 02C | A36 |
| 02D | 807 |
| 02E | E00 |
| 02F | EBA |
| 030 | A26 |
| 031 | EC0 |
| 032 | E40 |
| 033 | C07 |
| 034 | 667 |
| 035 | A25 |
| 036 | 656 |
| 037 | A3E |

| | |
|---|---|
| 038 | 866 |
| 039 | 221 |
| 03A | A2D |
| 03B | 876 |
| 03C | 211 |
| 03D | A2D |
| 03E | A2D |
| 03F | A3B |
| 040 | ECF |
| 041 | CE5 |
| 042 | C41 |
| 043 | C80 |
| 044 | C45 |

TIME OF DAY CONSUMPTION PROGRAM

| | |
|---|---|
| 045 | 08F |
| 046 | 41A |
| 047 | A60 |
| 048 | 084 |
| 049 | A4F |
| 04A | D0A |
| 04B | D1B |
| 04C | D1C |
| 04D | EC3 |
| 04E | D5C |
| 04F | D8A |
| 050 | C4D |
| 051 | D8B |
| 052 | C4E |
| 053 | D8C |
| 054 | C4F |
| 055 | 91F |
| 056 | 80D |
| 057 | 80E |
| 058 | 284 |
| 059 | 92F |
| 05A | C0D |
| 05B | C1E |
| 05C | 244 |
| 05D | 92E |
| 05E | EC1 |
| 05F | C54 |

ALARM SENSE PROGRAM

| | |
|---|---|
| 060 | 384 |
| 061 | A70 |
| 062 | 846 |
| 063 | 817 |
| 064 | E80 |
| 065 | C40 |
| 066 | 807 |
| 067 | EA0 |
| 068 | 230 |
| 069 | A70 |
| 06A | 877 |
| 06B | EEF |
| 06C | CD3 |
| 06D | C72 |
| 06E | EEF |
| 06F | C43 |

RECEIVE MODE

| | |
|---|---|
| 070 | 60A |
| 071 | B3F |
| 072 | 28F |
| 073 | B22 |
| 074 | 000 |
| 075 | 987 |
| 076 | 34B |
| 077 | A7D |
| 078 | D02 |
| 079 | D13 |
| 07A | 3E3 |
| 07B | 904 |
| 07C | BFF |
| 07D | 90E |
| 07E | 902 |
| 07F | 903 |
| 080 | 11F |
| 081 | A7B |
| 082 | D86 |
| 083 | C68 |
| 084 | D8E |
| 085 | C69 |
| 086 | D04 |
| 087 | 714 |
| 088 | A8E |
| 089 | 808 |
| 08A | 809 |
| 08B | 5F6 |
| 08C | 7FE |
| 08D | 904 |
| 08E | BFF |
| 08F | 724 |
| 090 | A9B |
| 091 | CEF |
| 092 | 8C0 |
| 093 | C70 |
| 094 | 6F0 |
| 095 | A8D |
| 096 | D86 |
| 097 | DE7 |
| 098 | CB0 |
| 099 | A8D |
| 09A | BFF |
| 09B | 734 |
| 09C | AA1 |
| 09D | D49 |
| 09E | D86 |
| 09F | D48 |
| 0A0 | BFF |
| 0A1 | 744 |
| 0A2 | AA7 |
| 0A3 | D41 |
| 0A4 | D86 |
| 0A5 | D40 |
| 0A6 | BFF |
| 0A7 | 4F8 |
| 0A8 | 6F9 |
| 0A9 | A8D |

RECEIVE MODE EXECUTION

| | |
|---|---|
| 0AA | 719 |
| 0AB | AAF |
| 0AC | D89 |
| 0AD | D44 |
| 0AE | B25 |
| 0AF | 728 |
| 0B0 | ACE |
| 0B1 | 509 |
| 0B2 | A8D |
| 0B3 | 3C9 |
| 0B4 | AC0 |
| 0B5 | EC4 |
| 0B6 | DF9 |
| 0B7 | C46 |
| 0B8 | 807 |
| 0B9 | EC0 |
| 0BA | E40 |
| 0BB | C07 |
| 0BC | 667 |
| 0BD | ABA |
| 0BE | 914 |
| 0BF | B25 |
| 0C0 | 749 |
| 0C1 | AC9 |
| 0C2 | 80D |
| 0C3 | 80E |
| 0C4 | 80F |
| 0C5 | 91F |
| 0C6 | BED |
| 0C7 | 924 |
| 0C8 | B25 |
| 0C9 | 759 |
| 0CA | A8D |
| 0CB | 802 |
| 0CC | 9A4 |
| 0CD | B25 |
| 0CE | 738 |
| 0CF | AE3 |
| 0D0 | EC4 |
| 0D1 | DF9 |
| 0D2 | C46 |
| 0D3 | 807 |
| 0D4 | 349 |
| 0D5 | 827 |
| 0D6 | 389 |

| | | | | |
|---|---|---|---|---|
| 0D7 | 847 | | 12A | EC3 |
| 0D8 | D80 | | 12B | CDD |
| 0D9 | E40 | | 12C | D40 |
| 0DA | C07 | | 12D | C8E |
| 0DB | D81 | | 12E | C4B |
| 0DC | E40 | | 12F | 8FD |
| 0DD | 657 | | 130 | 91F |
| 0DE | A8D | | 131 | C8D |
| 0DF | 914 | | 132 | D4A |
| 0E0 | 446 | | 133 | C8E |
| 0E1 | 924 | | 134 | D8B |
| 0E2 | B1F | | 135 | 90C |
| 0E3 | 748 | | 136 | ECC |
| 0E4 | AEF | | 137 | DF0 |
| 0E5 | 846 | | 138 | D47 |
| 0E6 | 509 | | 139 | 902 |
| 0E7 | AD7 | | 13A | 901 |
| 0E8 | 719 | | 13B | ECF |
| 0E9 | A8D | | 13C | CEB |
| 0EA | D80 | | 13D | D43 |
| 0EB | D45 | | 13E | 82A |
| 0EC | D81 | | TRANSMIT MODE | |
| 0ED | D4D | | 13F | 61A |
| 0EE | AE1 | | 140 | B46 |
| 0EF | D89 | | 141 | D02 |
| 0F0 | 758 | | 142 | 792 |
| 0F1 | AFB | | 143 | DFF |
| 0F2 | C4D | | 144 | 80F |
| 0F3 | D80 | | 145 | AE1 |
| 0F4 | C4E | | 146 | 62A |
| 0F5 | EC8 | | 147 | B63 |
| 0F6 | DF1 | | 148 | 40B |
| 0F7 | C4F | | 149 | B4D |
| 0F8 | 81A | | 14A | D01 |
| 0F9 | 902 | | 14A | D01 |
| 0FA | BFF | | 14B | 311 |
| 0FB | 768 | | 14C | BFF |
| 0FC | AFF | | 14D | 5D2 |
| 0FD | C4C | | 14E | B51 |
| 0FE | AC7 | | 14F | B02 |
| 0FF | 778 | | 150 | BFF |
| 100 | B03 | | 151 | 7F3 |
| 101 | C4B | | 152 | D03 |
| 102 | AC7 | | 153 | 5F3 |
| 003 | 788 | | 154 | B57 |
| 104 | A8D | | 155 | 902 |
| 105 | 90A | | 156 | BFF |
| 106 | 90B | | 157 | 14F |
| 107 | 90C | | 158 | 18F |
| 108 | D8A | | 159 | BFF |
| 109 | C4D | | 15A | 84A |
| 10A | D8B | | 15B | EC4 |
| 10B | C4E | | 15C | DF0 |
| 10C | D8C | | 15D | D47 |
| 10D | C4F | | 15E | 9F6 |
| 10E | 91F | | 15F | 9FE |
| 10F | D80 | | 160 | 8F8 |
| 110 | C4D | | 161 | 8F9 |
| 111 | D81 | | 162 | BFF |
| 112 | C4E | | 163 | EC4 |
| 113 | 92F | | 164 | DF0 |
| 114 | D0A | | 165 | D47 |
| 115 | D1B | | 166 | 34F |
| 116 | D1C | | 167 | BFF |
| 117 | 000 | | 168 | 64A |
| 118 | 000 | | 169 | B79 |
| 119 | 74C | | 16A | ECF |
| 11A | B08 | | 16B | DE7 |
| 11B | 9FA | | 16C | D48 |
| 11C | 9FB | | 16D | 939 |
| 11D | 93C | | 16E | ECF |
| 11E | 944 | | 16F | CEF |
| 11F | C8C | | 170 | D59 |
| 120 | D40 | | 171 | C0A |
| 121 | 04F | | 172 | D88 |
| 123 | A75 | | 173 | C68 |
| 124 | 974 | | 174 | D46 |
| 125 | 08F | | 175 | D89 |
| 126 | B36 | | 176 | C69 |
| 127 | 8ED | | 177 | D4E |
| 128 | 8FE | | 178 | DFF |
| 129 | 91F | | 179 | 65A |

-continued

| | |
|---|---|
| 17A | B86 |
| 17B | D85 |
| 17C | D48 |
| 17D | D8D |
| 17E | D49 |
| 17F | 86A |
| 180 | 504 |
| 181 | 87A |
| 182 | 903 |
| 183 | 902 |
| 184 | 901 |
| 185 | B72 |
| 186 | 66A |
| 187 | BDE |
| 188 | 114 |
| 189 | B9F |
| 18A | 502 |
| 18B | 952 |
| 18C | D82 |
| 18D | C46 |
| 18E | D81 |
| 18F | C47 |
| 190 | E80 |
| 191 | D48 |
| 192 | C07 |
| 193 | E80 |
| 194 | D49 |
| 195 | D01 |
| 196 | D01 |
| 197 | 761 |
| 198 | B72 |
| 199 | D02 |
| 19A | 782 |
| 19B | B84 |
| 19C | ECE |
| 19D | D54 |
| 19E | B7F |
| 19F | 124 |
| 1A0 | BC6 |
| 1A1 | 701 |
| 1A2 | BA9 |
| 1A3 | C8C |
| 1A4 | D48 |
| 1A5 | C8B |
| 1A6 | D49 |
| 1A7 | D01 |
| 1A8 | B72 |
| 1A9 | 846 |
| 1AA | 711 |
| 1AB | BB1 |
| 1AC | 867 |
| 1AD | EEF |
| 1AE | D48 |
| 1AF | C82 |
| 1B0 | BA6 |
| 1B1 | 721 |
| 1B2 | BB9 |
| 1B3 | 847 |
| 1B4 | E80 |
| 1B5 | D48 |
| 1B6 | C07 |
| 1B7 | E80 |
| 1B8 | BA6 |
| 1B9 | D8A |
| 1BA | C4D |
| 1BB | D8B |
| 1BC | C4E |
| 1BD | D8C |
| 1BE | C4F |
| 1BF | 91F |
| 1C0 | C8D |
| 1C1 | D48 |
| 1C2 | C8E |
| 1C3 | D49 |
| 1C4 | EC4 |
| 1C5 | B9D |
| 1C6 | D81 |
| 1C7 | C4D |
| 1C8 | D82 |
| 1C9 | C4E |
| 1CA | — D83 |
| 1CB | C4F |

-continued

| | |
|---|---|
| 1CC | 91F |
| 1CD | C8D |
| 1CE | D48 |
| 1CF | C8E |
| 1D0 | D49 |
| 1D1 | D83 |
| 1D2 | DBC |
| 1D3 | BDA |
| 1D4 | D82 |
| 1D5 | DBB |
| 1D6 | DBA |
| 1D7 | D81 |
| 1D8 | DAA |
| 1D9 | B71 |
| 1DA | D01 |
| 1DB | D12 |
| 1DC | D13 |
| 1DD | B72 |
| 1DE | 67A |
| 1DF | BE5 |
| 1E0 | C88 |
| 1E1 | D48 |
| 1E2 | C89 |
| 1E3 | D49 |
| 1E4 | B71 |
| 1E5 | 68A |
| 1E6 | BEA |
| 1E7 | 9E8 |
| 1E8 | 9E9 |
| 1E9 | B71 |
| 1EA | 38F |
| 1EB | 80A |
| 1EC | A7B |
| 1ED | 846 |
| 1EE | 847 |
| 1EF | E80 |
| 1F0 | C4D |
| 1F1 | 857 |
| 1F2 | E80 |
| 1F3 | C4E |
| 1F4 | 92F |
| 1F5 | 91A |
| 1F6 | 90B |
| 1F7 | 90C |
| 1F8 | 81D |
| 1F9 | 80E |
| 1FA | 91F |
| 1FB | 80D |
| 1FC | 92F |
| 1FD | AC7 |
| 1FE | 000 |
| 1FF | 856 |
| DONE | |

What is claimed is:

1. A transponder unit for use with a non-dedicated communication link comprising:
receiver means for receiving external instruction signals from said communication link;
transmitter means for transmitting data via said communication link;
a central processing unit (CPU) connected to said receiver means and said transmitter means;
a clock generator means for controlling said CPU;
a read only memory (ROM) connected to said CPU, said ROM containing a program for controlling said CPU;
a real time clock connected to said CPU for determining sequential predetermined time periods;
three input terminals connected to said CPU for receiving data to be stored in a random access memory (RAM), one of said three input terminals having pulses impressed thereon, the number of said pulses being representative of a utility consumption, said one of said three input terminals also being connected, via said CPU, to a time-of-day memory, said time-of-day memory being comprised of a plurality of discretely addressable registers, wherein said CPU correlates each addressable register sequentially with a consecutive one of said predetermined time periods, so that each register sequentially contains a count which is representative of consumption during its associated time period or any fraction thereof; wherein, upon receipt of one of said external instruction signals, said CPU activates said transmitter means to transmit data, said data being, in part, the contents of each register in said time-of-day meory transmitted in sequence; wherein one of said external instruction signals is an initialization signal which sets said real time clock, wherein initialization of said time-of-day memory can take place at any time during one of said predetermined time periods, wherein a first address of said time-of-day memory contains a count representing the fraction of a time period remaining after initialization, a second address contains a count representing consumption in said fraction of a time period, each subsequent address containing a count representing consumption in each subsequent time period, respectively;

said unit further comprising identification code word means connected to said CPU for setting an identification code word into said RAM, wherein said CPU provides comparator means which compares another of said external instruction signals with said identification code word, a positive comparison validating that the correct transponder unit has been selected.

2. The transponder according to claim 1 wherein said receiver means receives said external instruction signals in the form of FSK instruction signals and converts said FSK instruction signals to digital instruction signals.

3. The transponder according to claim 1, wherein said external instruction signals contain, in part, a series of five data words, the first word being an alert word, the second word being said identification code word, the third word being an instruction and control word, the fourth word being a data word and the fifth word being a block parity word, wherein each word must have a correct parity, wherein each word must have a correct time period, and wherein all said five data words must have a correct time period and correct block parity, whereby said external instruction signals become valid received instruction signals.

4. The transponder according to claim 3, wherein said CPU is connected to a plurality of relays via driver amplifiers, said relays being adapted for controlling loads, wherein, upon receipt of an appropriate one of said valid received instruction signals, said CPU activates said relays so as to activate or deactivate said loads.

5. The transponder according to claim 4, wherein said relays are latching relays and are activated only to change from a first switched state to a second switched state and from said second switched state to said first switched state.

6. The transponder according to claim 5, wherein each relay of said plurality of relays has a status terminal which has a first signal impressed thereon if said relay is in said first state and a second signal impressed thereon if said relay is in said second state, said status terminal being connected to said CPU, said first and second signals forming part of said data transmitted by said transmitter means upon receipt of an appropriate one of said valid received instruction signals.

7. The transponder according to claim 3, wherein a plurality of alarm input terminals are connected to said CPU for scanning thereby, each alarm terminal having an alarm condition signal impressed thereon, each said alarm condition signal forming part of said data transmitted by said transmitter means upon receipt of an appropriate one of said valid received instruction signals.

8. The transponder according to claim 2, wherein said receiver means includes an operational amplifier whose input is connected to said communication link, said operational amplifier having an output connected to a passband filter having a passband sufficient to pass mark and space frequencies of said FSK instruction signals and a mark and space detector means for converting periods of mark and space frequency to "high" and "low" logic level voltages, respectively.

9. The transponder according to claim 8, wherein said receiver means further includes a carrier detector circuit which feeds said FSK instruction signals to said mark and space detector means upon receipt of a mark frequency for a predetermined period of time.

10. The transponder according to claim 1, wherein said transmitter means includes an FSK generator which converts a digital data signal into a synthesized FSK data signal, wherein a "high" logic level voltage is converted into a burst of mark signal frequency each cycle of said frequency consisting of a digital approximation of a sinusoidal wave, wherein a "low" logic level voltage is converted into a burst of space signal frequency, each cycle of said frequency consisting of a digital approximation of a sinusoidal wave.

11. The transponder according to claim 10, wherein said transmitter means further includes a bandpass filter connected to said FSK generator, said filter having a band pass sufficiently narrow so as to smooth said synthesized FSK data signal.

12. The transponder according to claim 11, wherein said bandpass filter is an active filter and wherein said transmitter means further includes a power amplifier, said power amplifier and said active filter being activated by a signal generated by said CPU.

13. The transponder according to claim 12, wherein said power amplifier is connected to said communication link and wherein said power amplifier presents a high impedance to said communication link when in an inactive state.

14. The transponder according to claim 1, wherein said transmitter means transmits said data at a predetermined baud rate.

15. The transponder according to claim 14, wherein said predetermined baud rate is determined by a particular one of said external instruction signals.

16. The transponder according to claim 15, wherein said predetermined baud rate is selected from the group of baud rates consisting of 150, 300, 600 and 1200.

* * * * *